US008669605B2

(12) United States Patent
Shimizu (10) Patent No.: US 8,669,605 B2
(45) Date of Patent: Mar. 11, 2014

(54) SEMICONDUCTOR DEVICE AND ARRANGEMENT METHOD OF COMPENSATION CAPACITOR OF SEMICONDUCTOR DEVICE

(76) Inventor: Yoshiaki Shimizu, Tokyo (JP)

( * ) Notice: Subject to any disclaimer, the term of this patent is extended or adjusted under 35 U.S.C. 154(b) by 777 days.

(21) Appl. No.: 12/722,101

(22) Filed: Mar. 11, 2010

(65) Prior Publication Data

US 2010/0230734 A1 Sep. 16, 2010

(30) Foreign Application Priority Data

Mar. 16, 2009 (JP) .................................. 2009-063657

(51) Int. Cl.
*H01L 29/92* (2006.01)
*H01L 29/93* (2006.01)

(52) U.S. Cl.
USPC .................. 257/308; 257/595; 257/E29.345; 257/E21.396; 438/239; 438/250; 438/379; 365/210.12; 365/210.14

(58) Field of Classification Search
USPC ........... 257/296, E29.345, E29.396; 438/239, 438/241, 250–251, 393–394; 365/210.1, 365/210.11, 210.12, 210.14, 149, 63, 227
See application file for complete search history.

(56) References Cited

U.S. PATENT DOCUMENTS

| | | | | |
|---|---|---|---|---|
| 5,945,702 A * | 8/1999 | Nakanishi | .................. | 257/296 |
| 6,188,095 B1 * | 2/2001 | Hieke | ........................ | 257/296 |
| 6,377,322 B2 * | 4/2002 | Yamaguchi et al. | ............ | 349/42 |
| 6,438,052 B1 * | 8/2002 | Sekine | ........................ | 365/149 |
| 7,038,296 B2 * | 5/2006 | Laws | ............................ | 257/534 |
| 7,355,875 B2 * | 4/2008 | Takizawa | ........................ | 365/63 |
| 7,557,398 B2 * | 7/2009 | Ota | ............................. | 257/300 |
| 7,663,175 B2 * | 2/2010 | Komura et al. | ................. | 257/307 |
| 8,125,010 B2 * | 2/2012 | Mizushima | .................. | 257/295 |
| 8,203,149 B2 * | 6/2012 | Azuma | ........................ | 257/71 |
| 8,300,480 B2 * | 10/2012 | Furutani | ................. | 365/189.15 |
| 2001/0050385 A1 * | 12/2001 | Kotecki et al. | ................ | 257/296 |
| 2003/0095429 A1 * | 5/2003 | Hirose et al. | ................ | 365/149 |
| 2005/0157527 A1 * | 7/2005 | Hirose et al. | ................ | 365/63 |
| 2005/0190608 A1 * | 9/2005 | Matsuzaki et al. | ....... | 365/185.28 |
| 2006/0226462 A1 * | 10/2006 | Ota | .............................. | 257/298 |
| 2008/0061381 A1 * | 3/2008 | Hashimoto et al. | .......... | 257/393 |
| 2008/0297220 A1 * | 12/2008 | Matsuzaki et al. | ........... | 327/211 |
| 2009/0256180 A1 * | 10/2009 | Azuma | ........................ | 257/296 |
| 2010/0133589 A1 * | 6/2010 | Aruga et al. | ................. | 257/206 |
| 2011/0012180 A1 * | 1/2011 | Matsuzaki et al. | ........... | 257/295 |
| 2011/0080386 A1 * | 4/2011 | Kim et al. | ..................... | 345/204 |
| 2011/0254066 A1 * | 10/2011 | Miura | ........................... | 257/296 |
| 2013/0140642 A1 * | 6/2013 | Aruga et al. | ................. | 257/369 |

FOREIGN PATENT DOCUMENTS

| | | |
|---|---|---|
| JP | 63-310136 A | 12/1988 |
| JP | 11-186497 A | 7/1999 |
| JP | 2000-277618 A | 10/2000 |
| JP | 2006-253393 (A) | 9/2006 |
| JP | 2007-067207 A | 3/2007 |

* cited by examiner

*Primary Examiner* — Laura M Menz
*Assistant Examiner* — Maliheh Malek
(74) *Attorney, Agent, or Firm* — Foley & Lardner LLP (57) ABSTRACT

A semiconductor device comprises a circuit cell and a basic end cell. The circuit cell includes a plurality of elements aligned in a first direction, and the basic end cell is arranged adjacent to the circuit cell in the first direction and has a compensation capacitor capable of being connected to a supply voltage of the circuit cell. In the semiconductor device, a diffusion layer forming the compensation capacitor extends along the first direction in a predetermined region of the circuit cell.

15 Claims, 13 Drawing Sheets

SEMICONDUCTOR DEVICE AND ARRANGEMENT METHOD OF COMPENSATION CAPACITOR OF SEMICONDUCTOR DEVICE

BACKGROUND OF THE INVENTION

1. Field of the Invention

The present invention relates to a semiconductor device having a compensation capacitor, and particularly relates to a semiconductor device in which a basic end cell provided with the compensation capacitor is arranged adjacent to an end of a circuit cell, and to an arrangement method of the compensation capacitor.

2. Description of Related Art

In recent years, as increases in both scale and speed have been required for semiconductor devices, supply voltages thereof have become lower. Therefore, operating margin of a supply voltage against noise tends to decrease, and thus measures for stabilizing the supply voltage supplied to internal circuits of a semiconductor device have been required. A structure has been conventionally proposed in which compensation capacitors are arranged in a semiconductor device and are connected to a supply voltage line in order to suppress fluctuation of the supply voltage line (for example, refer to Patent Reference 1). For example, with reference to FIG. 3 of the Patent Reference 1, compensation capacitors 30 to 34 are arranged in empty regions at both ends in a longitudinal direction of the figure in a circuit cell and are capable of being connected to a desired supply voltage line through contacts. By this structure, capacitance values of the compensation capacitors can be obtained corresponding to the empty regions in the circuit cell, thereby suppressing the fluctuation of the supply voltage and stabilizing the operation of the semiconductor device.

Patent Reference 1: Japanese Patent Application Laid-open No. 2006-253393

However, even if the structure of the Patent Reference 1 is employed, the arrangement of the compensation capacitors is restricted by the empty regions in the circuit cell, and thus it may be often difficult to obtain compensation capacitors capable of reliably and sufficiently suppressing the fluctuation of the Meanwhile, since automatic cell design has come to be used in recent semiconductor devices for the purpose of drastically reducing the time required for cell design, the arrangement of the compensation capacitors is required to fit the automatic cell design.

Figure 13:
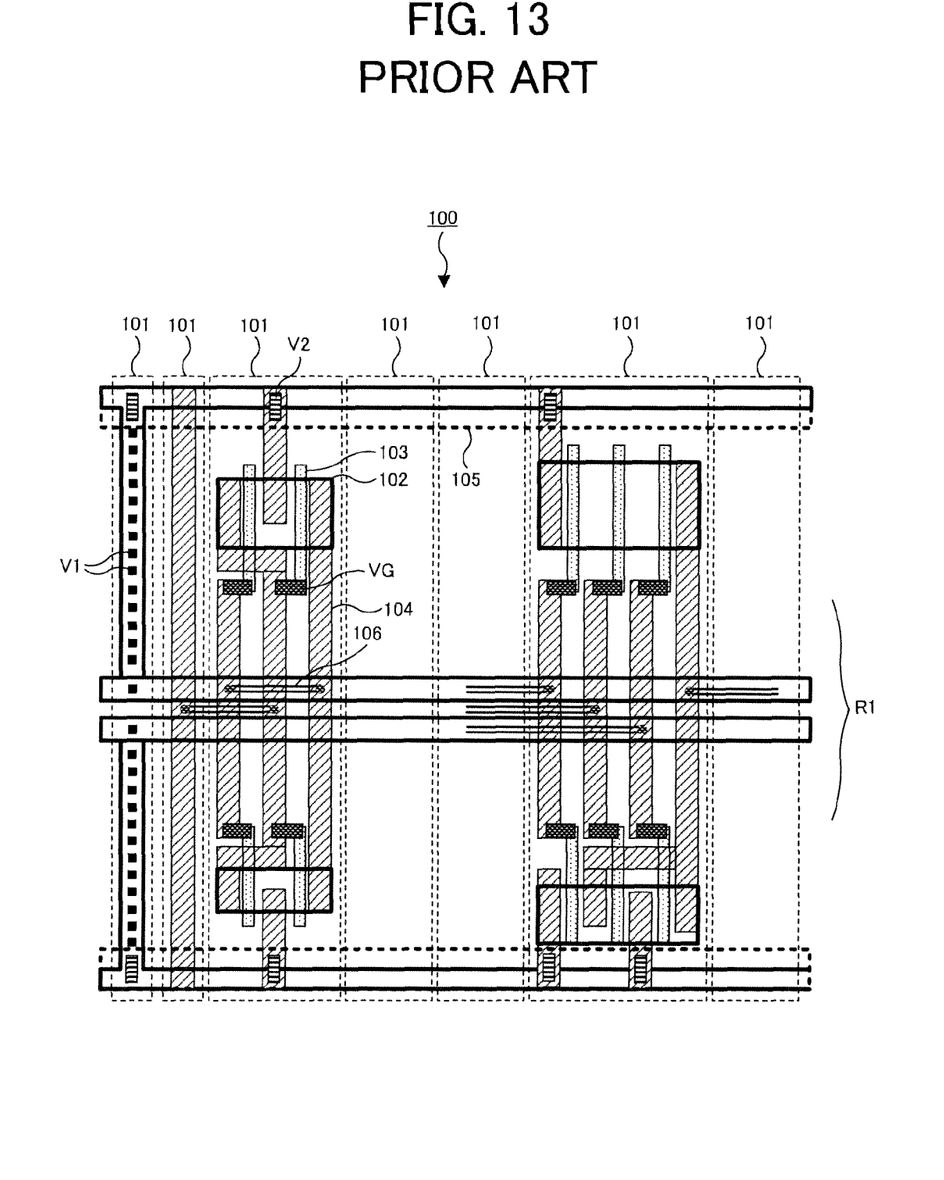
FIG. 13 is a diagram showing an example of automatic cell design in a conventional semiconductor device.

FIG. 13 shows an example of the automatic cell design in a semiconductor device. In FIG. 13, a circuit cell 100 of the semiconductor device is formed by aligning a plurality of elements 101 (e.g., inverters, NAND gates and NOR gates), which are preliminarily formed as components of a logic circuit achieving a predetermined function, in a lateral direction of FIG. 13 based on circuit information. Each of the elements 101 includes, for example, diffusion layers 102, gate lines 103, lines 104 of a metal layer M1, and lines 105 of a metal layer M2. Further, there are provided contacts V1 connecting between the diffusion layers 102 and the metal layer M1, contacts V2 connecting between the metal layers M1 and M2, and contacts VG connecting between the metal layer M1 and the gate lines 103.

Here, in the following description, "circuit cell" means a cell formed using one or more elements such as inverters, NAND gates and NOR gates. Accordingly, "circuit cell" can be formed using one element, and can be formed using a combination of a plurality of elements.

Upper and lower parts of FIG. 13 are a P-channel region and an N-channel region respectively, and a region therebetween is an inter-element connection region R1. In the automatic cell design, circuit connection is completed by connecting predetermined lines 104 to each other using connecting lines 106 of the metal layer M2 in the inter-element connection region R1 based on the circuit information. Therefore, the inter-element connection region R1 needs to have a size capable of arranging a plurality of connecting lines 106 in parallel. Although lines of the metal layers M1 and M2 are arranged in the inter-element connection region R1 shown in FIG. 13, there is a region therebelow where the diffusion layers 102 and the gate lines 103 are not arranged. If the circuit connection of the circuit cell 100 becomes complicated, an area of the inter-element connection region R1 is enlarged, and utilizing this area effectively has been a problem to be solved.

SUMMARY

The present invention seeks to solve one or more of the above problems and provides a semiconductor device capable of suppressing fluctuation of a supply voltage reliably by obtaining a sufficient compensation capacitor without being restricted by arrangement of a circuit cell and effectively utilizing a region in the circuit cell corresponding to arrangement of automatic cell design, and provides an arrangement method of the compensation capacitor.

One of aspects of the present invention is a semiconductor device comprising: a circuit cell including a plurality of elements aligned in a first direction; and a basic end cell arranged adjacent to the circuit cell in the first direction and having a compensation capacitor capable of being connected to a supply voltage of the circuit cell, wherein a diffusion layer forming the compensation capacitor extends along the first direction in a predetermined region of the circuit cell.

According to the semiconductor device of the aspect, the basic end cell is arranged adjacent to the circuit cell including the plurality of elements in the first direction, and the diffusion layer forming the compensation capacitor extends in the first direction in the predetermined region of the circuit cell. Therefore, the compensation capacitor of the basic end cell can be arranged without being restricted by the elements of the circuit cell, and can be freely connected to a desired supply voltage in the circuit cell so as to suppress fluctuation of the supply voltage. In this case, the predetermined region (for example, an inter-element connection region in the circuit cell) can be effectively utilized, and the compensation capacitor can be sufficiently increased without an increase in chip area.

One of aspects of the present invention is an arrangement method of a semiconductor device having a compensation capacitor capable of being connected to a supply voltage of a circuit cell, the method comprising: aligning a plurality of elements in a first direction; arranging a basic end cell having the compensation capacitor so as to be adjacent to an end of the circuit cell in the first direction; elongating a diffusion layer forming the compensation capacitor along the first direction from the basic end cell into a predetermined region of the circuit cell; and connecting a line of a predetermined supply voltage in the circuit cell to the compensation capacitor.

According to the method of the aspect, in a state in which the plurality of elements are previously arranged in the circuit cell, the compensation capacitor of the basic end cell can be automatically arranged into the circuit cell, in addition to the above-mentioned effects. Thus, automatic arrangement process suitable for the automatic cell design is performed, and the compensation capacitor can be increased by effectively utilizing empty regions in the circuit cell without increasing process steps.

As described above, according to the present invention, the compensation capacitor to be connected to the supply voltage of the circuit cell of the semiconductor device is formed in the basic end cell arranged adjacent to the circuit cell, and therefore the compensation capacitor can be arranged without being restricted by arrangement of the plurality of elements in the circuit cell. Since the compensation capacitor is formed so as to extend from basic end cell to the circuit cell, a space such as the inter-element connection region in the circuit cell can be effectively utilized to obtain the compensation capacitor having a large capacitance value. Accordingly, fluctuation of the supply voltage of the circuit cell can be suppressed, thereby preventing defects caused by supply voltage noise. Further, generation process of the compensation capacitor can be adequately adapted to the automatic cell design, and can be implemented into an integrated process so as to sufficiently decrease process steps required for the arrangement.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, two of the embodiments will be described in which the present invention is applied to a semiconductor device.

First Embodiment

Figure 1:
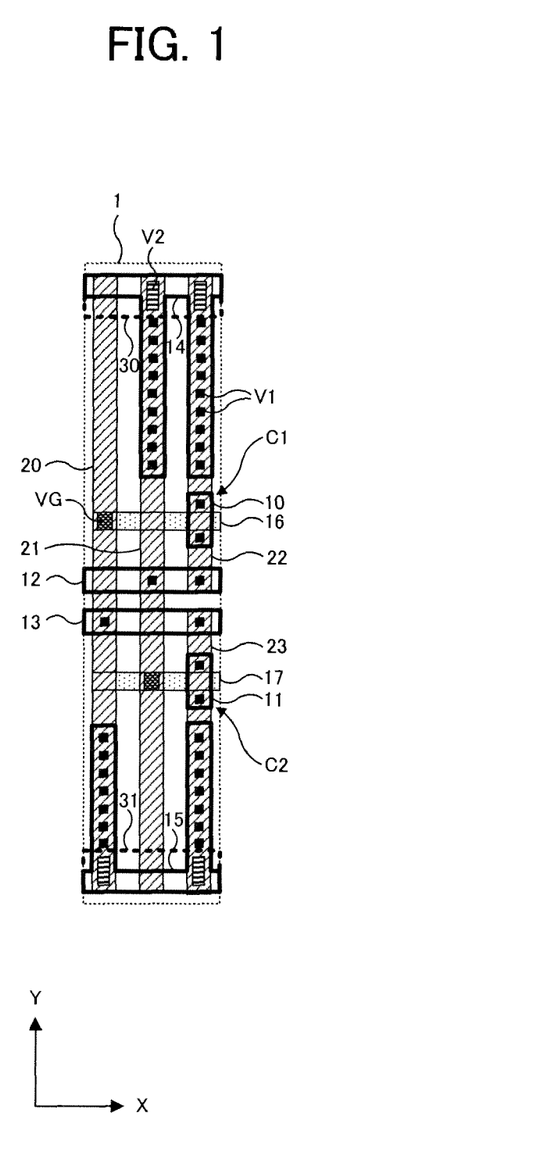
FIG. 1 is a diagram showing a structure example of a basic end cell 1 arranged adjacent to a circuit cell in a semiconductor device of a first embodiment.

FIG. 1 is a diagram showing a structure example of a basic end cell 1 arranged adjacent to a circuit cell in a semiconductor device of a first embodiment. The basic end cell 1 shown in FIG. 1 is a cell for connecting compensation capacitors C1 and C2 to a supply voltage of the semiconductor device, and is provided with lower diffusion layers 10 and 11 forming the compensation capacitors C1 and C2, a well contact (diffusion layer) 12 and a sub-contact (diffusion layer) 13 formed to stabilize the potential of a substrate, a well contact (diffusion layer) 14 and a sub-contact (diffusion layer) 15 in a layer below a supply voltage line, gate lines 16 and 17 over the compensation capacitors C1 and C2, lines 20, 21, 22 and 23 formed in a metal layer M1 as a first layer, and lines 30 and 31 formed in a metal layer M2 as a second layer. Further, there are provided two contacts (vias) VG connecting between each of the gate lines 16 and 17 and the metal layer M1, a large number of contacts V1 connecting between each diffusion layer and the metal layer M1, and four contacts V2 connecting between the metal layers M1 and M2. In addition, in the basic end cell 1, the upper half area of FIG. 1 is assumed to be a P-channel region and the lower half area of FIG. 1 is assumed to be an N-channel region. Accordingly, the diffusion layers 10 and 11 for the compensation capacitors C1 and C2 are of a P-type and an N-type, respectively, which are formed respectively in a well portion of the N-type and a substrate portion of the P-type. On the other hand, the well contact regions 12 and 14 are of the N-type and the sub-contact regions 13 and 15 are of the P-type. Thus, the cell 1 includes equivalently two capacitors coupled in parallel between the lines 30 and 31, which are formed as the second-level wiring layer M2 of a multi-level wiring structure and are respectively supplied with a power voltage and a ground voltage. The lines 20, 21, 22 and 23 are formed as the first-level wiring layer M1 of the multi-level wiring structure. Note that the gate lines 16 and 17, each serving as an upper electrode of the capacitor, are formed over respective portions of the well portion and the substrate portion with an intervention of a dielectric film.

In the above structure, a transistor structure formed by the diffusion layer 10 and the gate line 16 thereabove functions as a P-type compensation capacitor C1. The gate line 16 over the compensation capacitor C1 is connected to the sub-contact 13 through the contacts VG, the line 20 and the contacts V1. Source/drain of the compensation capacitor C1 is connected to the line 22 through the contacts V1. The line 22 is connected to the well contact 14 and the lines 30 and 21 through the contacts V1 and V2, and is also connected to the well contact 12 through the contacts V1. The compensation capacitor C1 functions as the P-type compensation capacitor by supplying a high voltage to the diffusion layer 10 and supplying a low voltage to the gate line 16.

On the other hand, a transistor structure formed by the diffusion layer 11 and the gate line 17 thereabove functions as an N-type compensation capacitor C2. The gate line 17 over the compensation capacitor C2 is connected to the well contact 12 through the contacts VG, the line 21 and the contacts V1. Source/drain of the compensation capacitor C2 is connected to the line 23 through the contacts V1. The line 23 is connected to the sub-contact 15 and the lines 31 and 20 through the contacts V1 and V2, and is also connected to the sub-contact 13 through the contacts V1. The compensation capacitor C2 functions as the N-type compensation capacitor by supplying a low voltage to the diffusion layer 11 and supplying a high voltage to the gate line 17.

X axis and Y axis are shown for convenience in the lower part of FIG. 1, and the basic end cell 1 of FIG. 1 can be formed in a wiring space of three lines extending in a Y direction in the metal layer M1. It is assumed that the basic end cell 1 is arranged adjacent to a circuit cell (formed with one or more elements such as inverters, NAND gates and NOR gates) located on the right side thereof in an X direction (the first direction of the invention). In this case, the diffusion layers 10 and 11 corresponding to the compensation capacitors C1 and C2 and the gate lines 16 and 17 are respectively formed to extend into the circuit cell adjacent in the X direction, and the well contact 12, the sub-contact 13, the well contact 14, the sub-contact 15, the lines 30 and 31 are respectively shared by the basic end cell 1 and the circuit cell. Then, the compensation capacitors C1 and C2 are connected to a desired line of the supply voltage supplied to the circuit cell, and thereby fluctuation of the supply voltage can be suppressed.

Figure 2:
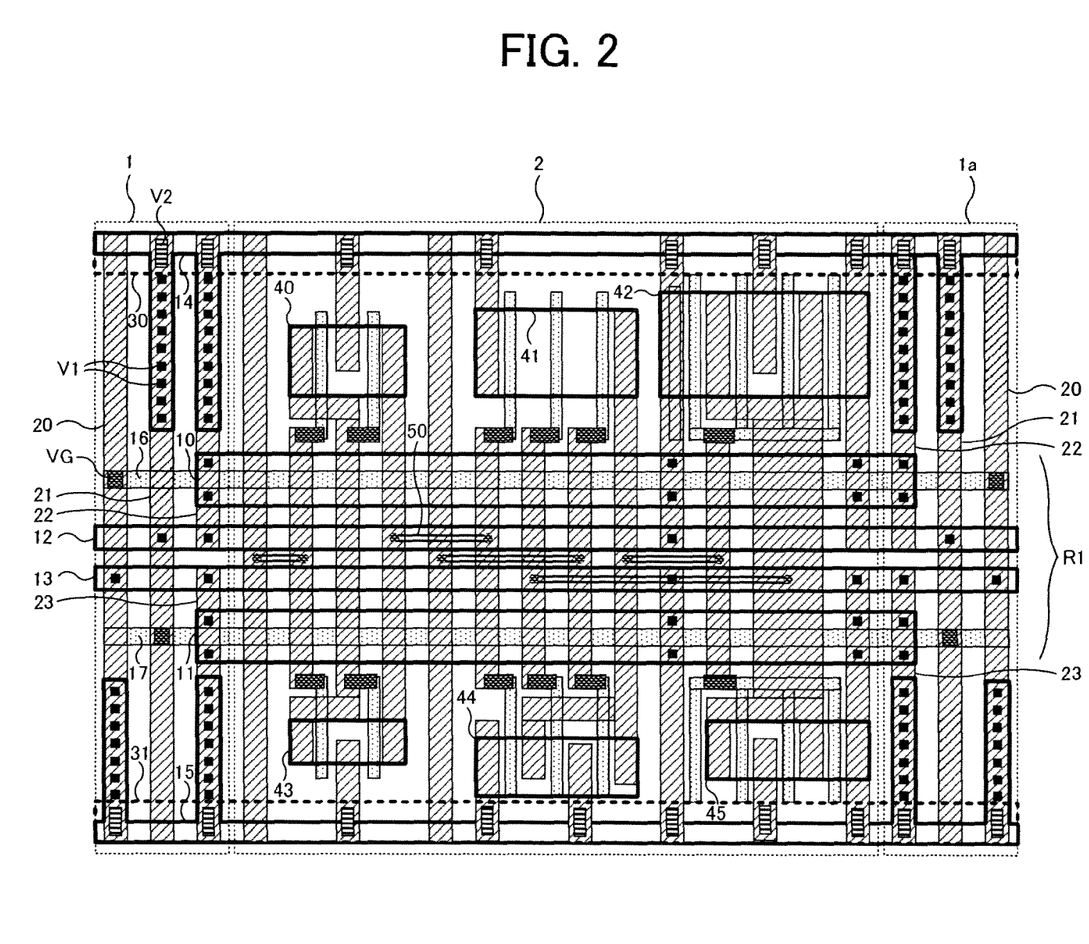
FIG. 2 is a diagram showing a layout example formed using the basic end cell 1 of FIG. 1 in the semiconductor device of the first embodiment.

FIG. 2 shows a layout example formed using the basic end cell 1 of FIG. 1 in the semiconductor device of the first embodiment. The layout example shown in FIG. 2 includes a basic end cell 1 arranged at the left end, a basic end cell 1a arranged at the right end, and a circuit cell 2 arranged in a region between the basic end cells 1 and 1a at the both ends. Here, the basic end cell 1a at the right end has an arrangement where left and right sides of the basic end cell 1 of FIG. 1 are inverted (mirror arrangement), and has the same basic function as that of the basic end cell 1.

The circuit cell 2 includes a plurality of elements aligned in the X direction (FIG. 1), and a group of P-channel transistors formed in diffusion layers 40, 41 and 42 of the P-channel region and a group of N-channel transistors formed in diffusion layers 43, 44 and 45 of the N-channel region are provided in the circuit cell 2. The transistors are formed in various sizes and are provided with gate lines over the diffusion layers and a large number of lines of the metal layer M1 each of which is connected to each source/drain. In FIG. 2, contacts connected to each source/drain of the transistors are omitted. Further, an inter-element connection region R1 between the P-channel region and the N-channel region is a region in which lines extending in the Y direction (FIG. 1) in the metal layer M1 are connected to each other through a plurality of connecting lines 50 of the metal layer M2 extending in the X direction in the inter-element connection region R1. In addition, the circuit cell 2 is provided with a large number of the contacts VG, V1 and V2 in addition to the above elements, and a predetermined logic circuit is configured by interconnecting a plurality of elements. Description of specific connections between the elements in the circuit cell 2 and operation of the logic circuit will be omitted.

The basic end cells 1 and 1a at the both ends of FIG. 2 and the circuit cell 2 share the diffusion layers 10 and 11 corresponding to the compensation capacitors C1 and C2 and the gate lines 16 and 17 thereabove, and also share the well contact 12 and the sub-contact 13. Thus, the diffusion layers 10 and 11, the gate lines 16 and 17, and the well contact 12 and the sub-contact 13 are respectively formed to extend along the X direction over the basic end cells 1 and 1a at the both ends and the inter-element connection region R1 (the predetermined region of the invention) of the circuit cell 2. The well contact 14, the sub-contact 15 and the lines 30 and 31 are similarly shared by the basic end cells 1 and 1a at the both ends and the circuit cell 2.

In FIG. 2, when the compensation capacitors C1 and C2 are connected to a supply voltage of a desired element included in the circuit cell 2, the contacts V1 may be formed at corresponding positions in the inter-element connection region R1 so as to be connected to a predetermined line of the metal layer M1. The well contact 12 and the sub-contact 13 may be connected in the same manner. In addition, although FIG. 2 shows the layout example in which the diffusion layers 10 and 11 corresponding to the compensation capacitors C1 and C2 and the gate lines 16 and 17 are shared by the basic end cells 1 and 1a at the both ends, the layout may be divided halfway by an obstacle. This point will be described in detail later.

As described above, in the semiconductor device of the first embodiment, the compensation capacitors C1 and C2 are formed in the basic end cell 1 arranged separately from the circuit cell 2, and the compensation capacitors C1 and C2 extending into the inter-element connection region R1 in the circuit cell 2 can be connected to the supply voltage. Therefore, the compensation capacitors C1 and C2 can be arranged utilizing the space below the inter-element connection region R1 effectively without being restricted by whether or not empty regions exist in the circuit cell 2. Thus, the compensation capacitors C1 and C2 each having a sufficient capacitance value can be obtained without increasing the chip size of the semiconductor device, thereby reliably stabilizing the supply voltage supplied to the circuit cell 2.

Figure 3:
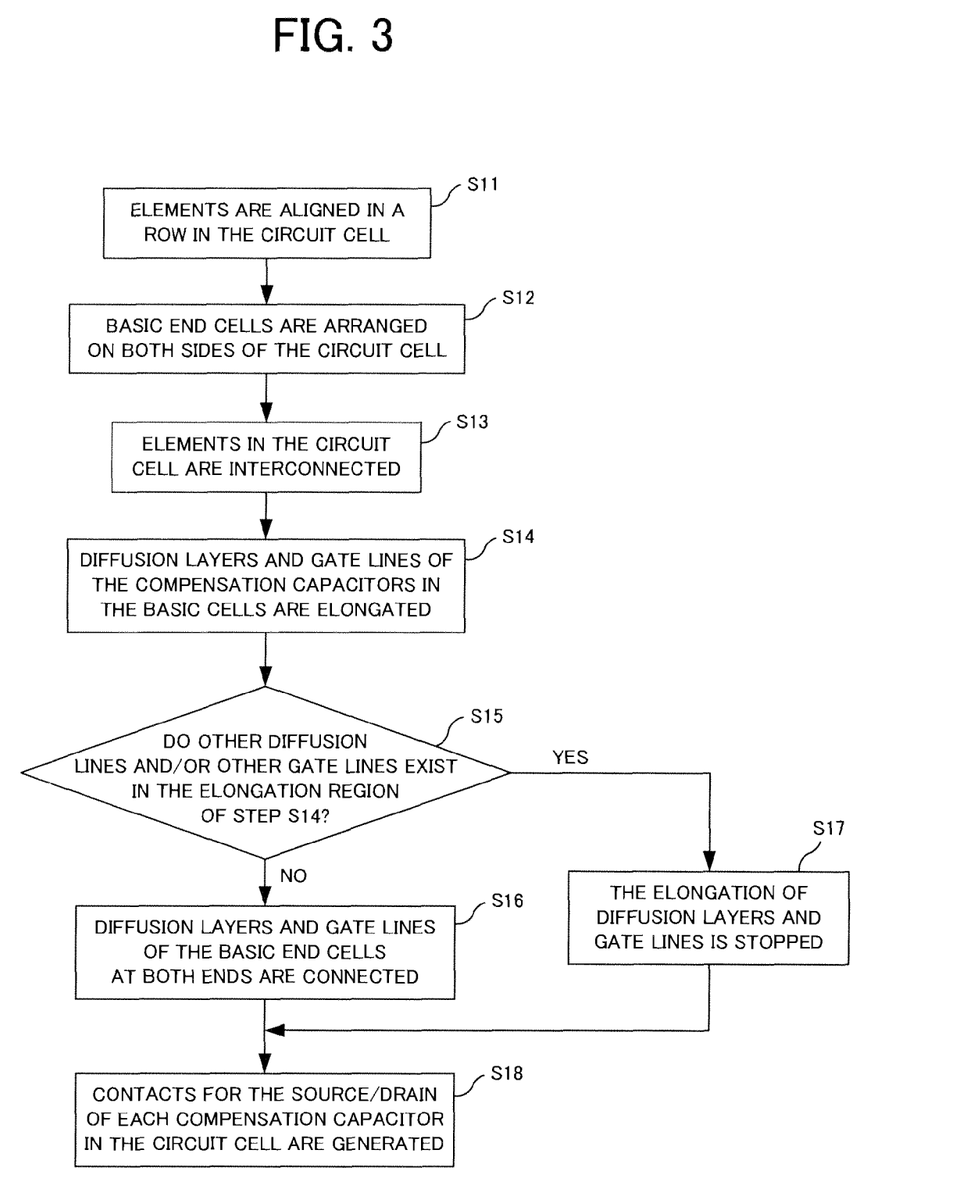
FIG. 3 is a flow chart explaining a generation process of a compensation capacitor in the layout of the semiconductor device of the first embodiment.

Next, FIG. 3 shows a flow chart explaining a generation process of the compensation capacitor in the layout of the semiconductor device of the first embodiment. When the process shown in FIG. 3 is started, circuit information of a target circuit cell 2 is obtained, and elements forming a predetermined logic circuit are aligned in a row in the X direction in accordance with the circuit information (step S11). Thereby, the diffusion layers and the gate lines corresponding to transistors included in each element in the circuit cell 2, lines in the metal layers M1 and M2, and the contacts VG, V1 and V2 connecting them are arranged at predetermined positions.

Subsequently, the basic end cells 1 and 1a are arranged on both sides of the circuit cell 2 which is arranged in step S11 (step S12). For example, as shown in FIG. 2, the basic end cell 1 is arranged on the left side of the circuit cell 2, and the basic end cell 1a with a mirror arrangement is arranged on the right side of the circuit cell 2. At this point, the diffusion layers 10 and 11 corresponding to the compensation capacitors C1 and C2 and the gate lines 16 and 17 are arranged only inside the basic end cells 1 and 1a and do not extend to the circuit cell 2. On the other hand, since the well contact 12 and the sub-contact 13 are assumed to extend over the basic end cells 1 and 1a at the both ends and the circuit cell 2 because they are assumed to be arranged in the inter-element connection region R1 of the circuit cell 2. Similarly, the well contact 14 and the sub-contact 15 are assumed to extend over the basic end cells 1 and 1a at the both ends and the circuit cell 2.

Subsequently, elements included in the circuit cell 2 are interconnected in accordance with the circuit configuration (step S13). Thereby, for example, the connecting lines 50 of the metal layer M2 are arranged at predetermined positions in the circuit cell 2 of FIG. 2 so that targeted lines of the metal layer M1 are interconnected.

Subsequently, the diffusion layers 10 and 11 corresponding to the compensation capacitors C1 and C2 and the gate lines 16 and 17 in the basic end cells 1 and 1a are elongated along the X direction into the circuit cell 2 (step S14). When exemplifying the basic end cell 1 of FIG. 2, respective positions of right ends of the diffusion layers 10 and 11 and the gate lines 16 and 17 are shifted to the right where the inter-element connection region R1 of the circuit cell 2 exists. At this point, it is determined whether or not other diffusion layers and/or other gate lines exist in the elongation region of the diffusion layers 10 and 11 and the gate lines 16 and 17 (step S15), thereby moving to step S16 or S17 according to the determination result.

Figure 4:
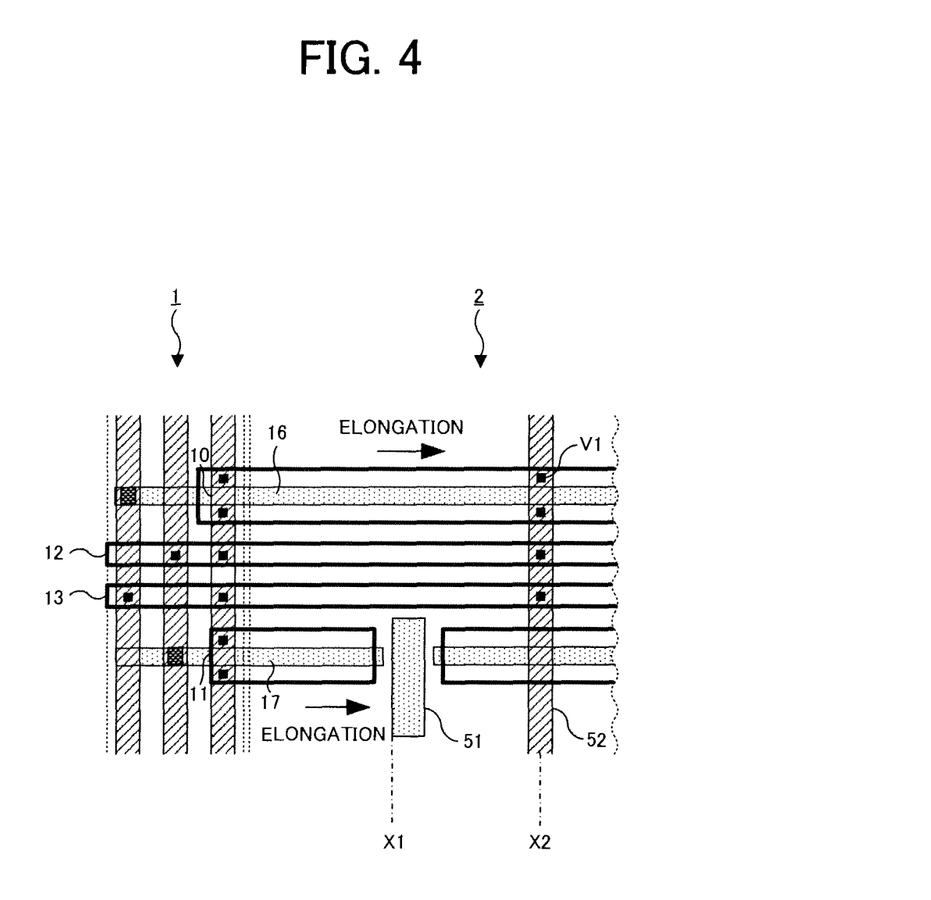
FIG. 4 is a diagram schematically showing a state of the process of steps S14 to S17.

Here, FIG. 4 schematically shows a state of the process of steps S14 to S17. When no other diffusion layer nor gate line exists in the elongation region of the diffusion layers 10 and 11 and the gate lines 16 and 17 (step S15:NO), the diffusion layers 10 and 11 and the gate lines 16 and 17 of the basic end cell 1 of one side are connected with corresponding layers and lines of the basic end cell 1a of the other side (step S16). In the example of FIG. 4, step S16 is performed for the diffusion layer 10 and the gate line 16 in the P-channel region, and they are elongated over the entire circuit cell 2. In contrast, when other diffusion layer or gate line exists in the elongation region for elongating the diffusion layers 10 and 11 and the gate lines 16 and 17 (step S15:YES), the elongation is stopped before reaching the other diffusion layer or gate line (step S17). In the example of FIG. 4, since a gate line 51 acting as an obstacle exits beyond a position X1 in the X direction, step S17 is performed for the diffusion layer 11 and the gate line 17 in the N-channel region so that each of them is in a state of being separated at a halfway point in the circuit cell 2.

Subsequently, the contacts V1 connected to lines of the metal layer M1 are automatically generated at each intersection (source/drain) with an element to be connected to the compensation capacitors C1 and C2 in the circuit cell 2 for the diffusion layers 10 and 11 elongated in step S15 (step S18). In the example of FIG. 4, the contacts V1 are generated at a position X2 in the X direction for the diffusion layer 10 of the P-channel region. In addition, each line connected to the compensation capacitors C1 and C2 through the contacts V1 in step S18 is connected to the well contact 12 or the subcontact 13. It is possible to achieve a layout in which the circuit cell 2 and the basic end cells 1 and 1a are combined together, and the supply voltage of the circuit cell 2 can be stabilized using the compensation capacitors C1 and C2.

The generation process of the compensation capacitor which is shown in the flow chart of FIG. 3 can be programmed and implemented in the automatic cell design of the semiconductor device. Thereby, it is possible to reduce process steps for arranging the compensation capacitor in the circuit cell. Further, flatness can be improved in using CMP by arranging the diffusion layers 10 and 11 and the gate lines 16 and 17 in the circuit cell 2. The flow chart shown in FIG. 3 is one example, for which each process step can be modified or added. Furthermore, in the flow chart of FIG. 3, the process shown in steps S14 to S17 concerning the elongation of the diffusion layer and the gate line of the compensation capacitor may be performed separately from the generation process of the compensation capacitor.

Figure 5:
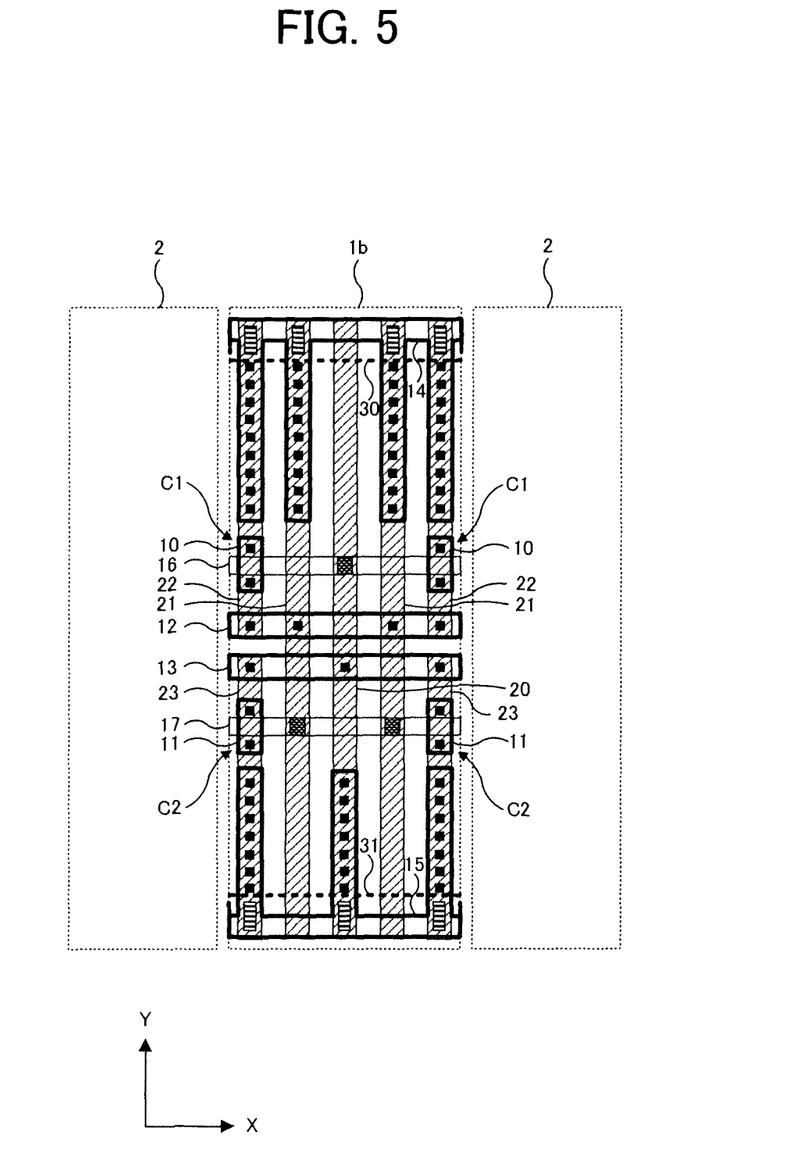
FIG. 5 is a diagram showing a structure example of a basic end cell 1b which is a first modification of the basic end cell 1.

In the first embodiment, the structure of the basic end cell 1 is not limited to that of FIG. 1 or the basic end cell 1a of FIG. 2, and has many variations. In the following, three typical modifications of the basic end cell 1 will be described. FIG. 5 shows a structure example of a basic end cell 1b which is a first modification of the basic end cell 1. The basic end cell 1b of FIG. 5 is obtained by overlapping the basic end cell 1 and the basic end cell 1a (FIG. 2) with the mirror arrangement, and is arranged symmetrically on both sides in the X direction. Specifically, the diffusion layers 10 and 11 corresponding to the compensation capacitors C1 and C2 and the gate lines 16 and 17 are arranged in a mirror manner on the both sides, and the lines 21, 22 and 23 of the metal layer M1 are also arranged symmetrically on the both sides. The circuit cell 2 is arranged on the left side of the basic end cell 1b, and the other circuit cell 2 is arranged on the right side of the basic end cell 1b. Also, a plurality of basic end cells 1b and a plurality of circuit cells 2 can be arranged alternately along the X direction.

When performing the generation process of the compensation capacitor shown in FIG. 3 using the basic end cell 1b of the first modification, the process shown in steps S14 to S17 concerning the elongation of the diffusion layer and the gate line is performed for both two circuit cells 2 arranged on both sides in the X direction of the basic end cell 1b. Similarly, the generation of the contacts V1 in step S18 is performed for the both circuit cells 2 arranged on the both sides.

Figure 6:
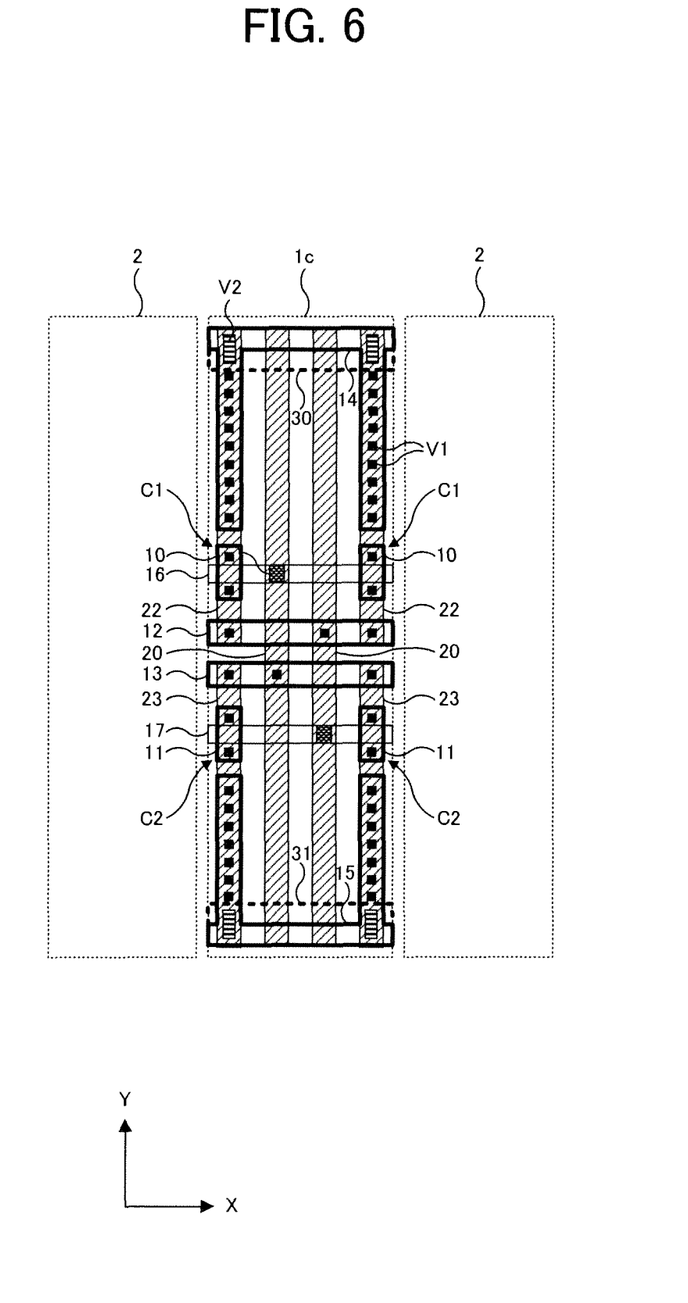
FIG. 6 is a diagram showing a structure example of a basic end cell 1c which is a second modification of the basic end cell 1.

FIG. 6 shows a structure example of a basic end cell 1c which is a second modification of the basic end cell 1. Although the basic end cell 1b of FIG. 5 is formed in a wiring space of five lines of the metal layer M1, it is a feature that the basic end cell 1c of FIG. 6 having the same function is formed in a wiring space of four lines of the metal layer M1. Specifically, three lines on the right, except one line on the left, correspond to the basic end cell 1, and three lines on the left, except one line on the right, correspond to part of the mirror arrangement of the basic end cell 1, where positions of the lines 20 and 21 are replaced with each other. By stacking these cells to share the lines 20 and 21 included in the basic end cell 1, the basic end cell 1c is formed. In case of the basic end cell 1c, the two circuit cells 2 are arranged respectively on both sides thereof similarly as in the basic end cell 1b.

When performing the generation process of the compensation capacitor shown in FIG. 3 using the basic end cell 1c of the second modification, the process shown in steps S14 to S17 concerning the elongation of the diffusion layer and the gate line and the generation of the contacts V1 in step S18 are performed for the both circuit cells 2 arranged on the both sides.

Figure 7:
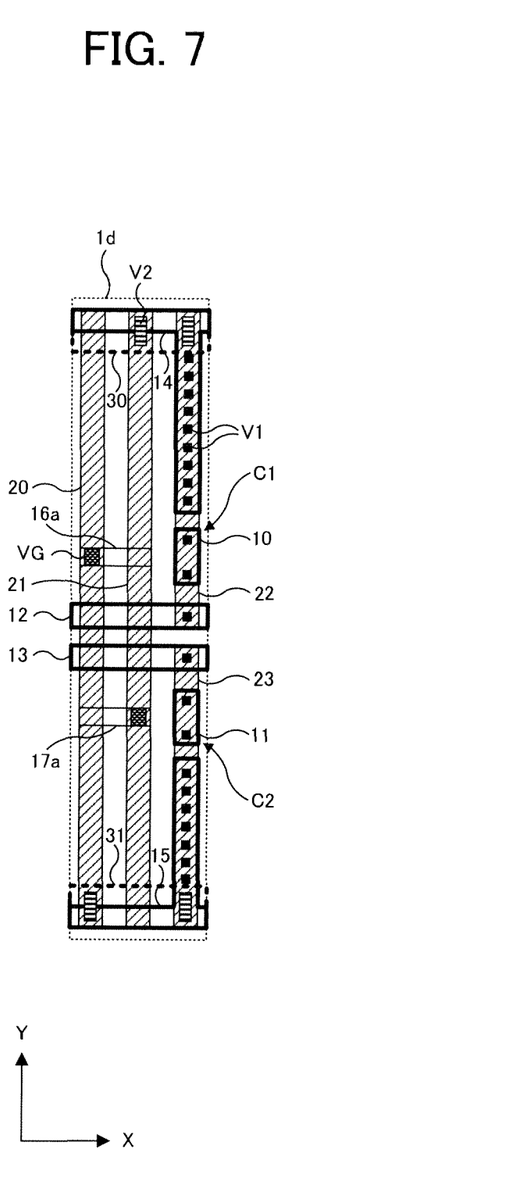
FIG. 7 is a diagram showing a structure example of a basic end cell 1d which is a third modification of the basic end cell 1.

FIG. 7 shows a structure example of a basic end cell 1d which is a third modification of the basic end cell 1. It is a feature of the basic end cell 1d of FIG. 7 that gate lines 16a and 17a are not arranged over the diffusion layers 10 and 11 corresponding to the compensation capacitors C1 and C2. That is, each right end of the gate lines 16a and 17a terminates at a position overlapping the line 21. Thus, the compensation capacitors C1 and C2 of the basic end cell 1d of FIG. 7 do not form a transistor structure. Thereby, circuit consistency can be checked in a state where the compensation capacitors C1 and C2 to be added in the circuit cell 2 do not exist, and it is possible to perform a batch process including steps S14 to S18 of the generation process of the compensation capacitor shown in FIG. 3 as a post process.

Figure 8:
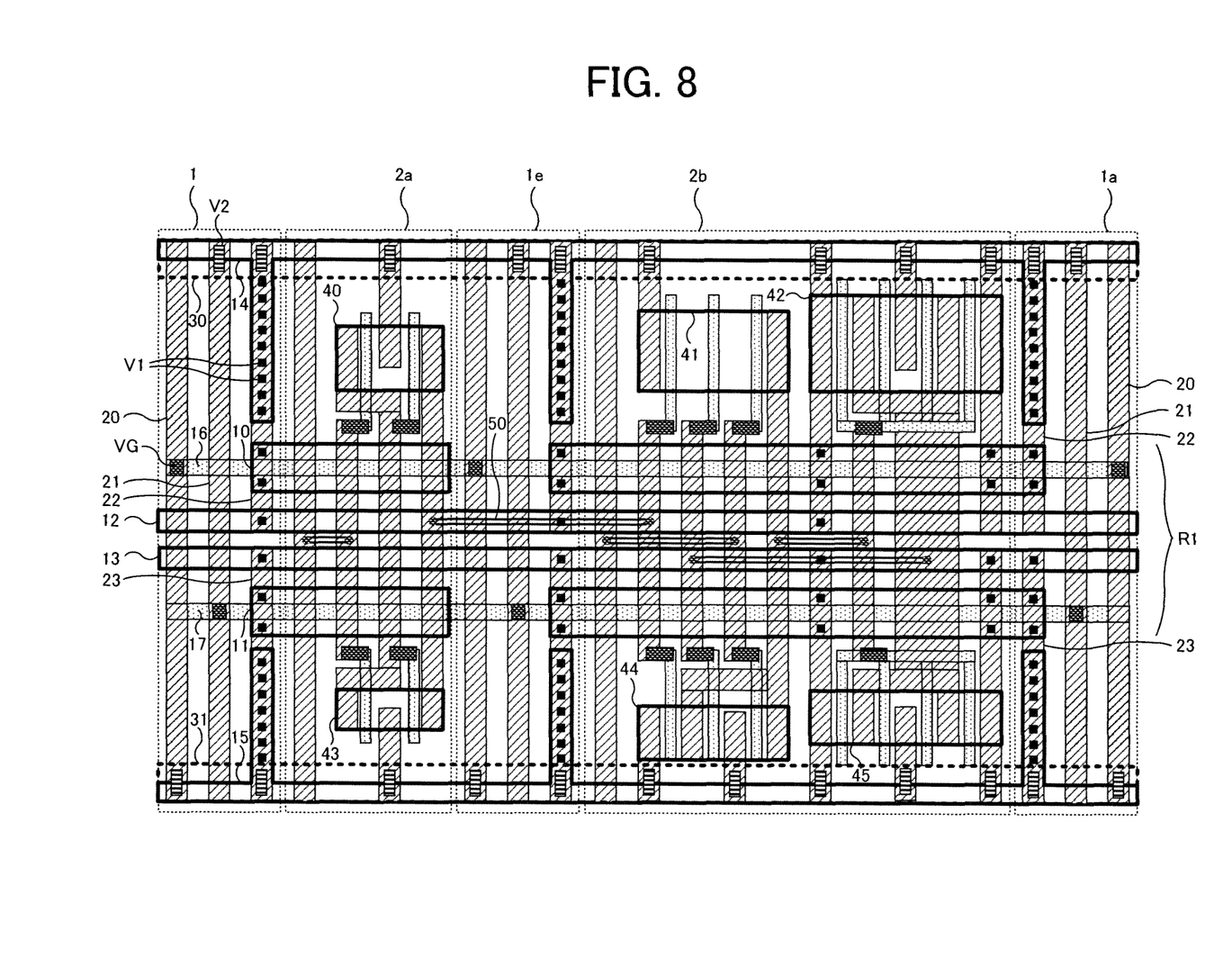
FIG. 8 is a diagram showing one of modifications corresponding to the layout example shown in FIG. 2.

Meanwhile, in the first embodiment, the layout example of FIG. 2 is not limited to the above structure and has many variations. FIG. 8 shows one of modifications corresponding to the layout example shown in FIG. 2. The layout example of FIG. 8 is different from FIG. 2 in that another basic end cell 1e is arranged in the circuit cell 2 in addition to the basic end cells 1 and 1a arranged on both sides of the circuit cell 2. That is, in FIG. 8, the circuit cell 2 of FIG. 2 is divided into a left side region 2a and a right side region 2b, and the basic end cell 1e is arranged in a region between the two regions 2a and 2b. The structure of the basic end cell 1e is the same as that of the basic end cell 1 of FIG. 1.

As shown in FIG. 8, the diffusion layers 10 and 11 corresponding to the compensation capacitors C1 and C2 in the basic end cell 1e is elongated to the region 2b on the right side of the circuit cell 2 and is shared with the basic end cell 1a at the right end. On the other hand, the diffusion layers 10 and 11 corresponding to the compensation capacitors C1 and C2 in the basic end cell 1 at the left end terminate at the right end of the region 2a on the left side of the circuit cell 2. In addition, each of the gate lines 16 and 17 of the compensation capacitors C1 and C2 in the three basic end cells 1, 1e and 1a is connected over the entire region to form one line. In this case, the contacts VG of the basic end cells 1, 1e and 1a are connected to each of the gate lines 16 and 17 so as to sufficiently supply the supply voltage. By employing the structure of FIG. 8, an effect of enhancement of the supply voltage or the like can be expected regardless of restriction of a layout area in comparison with FIG. 2.

Figure 9:
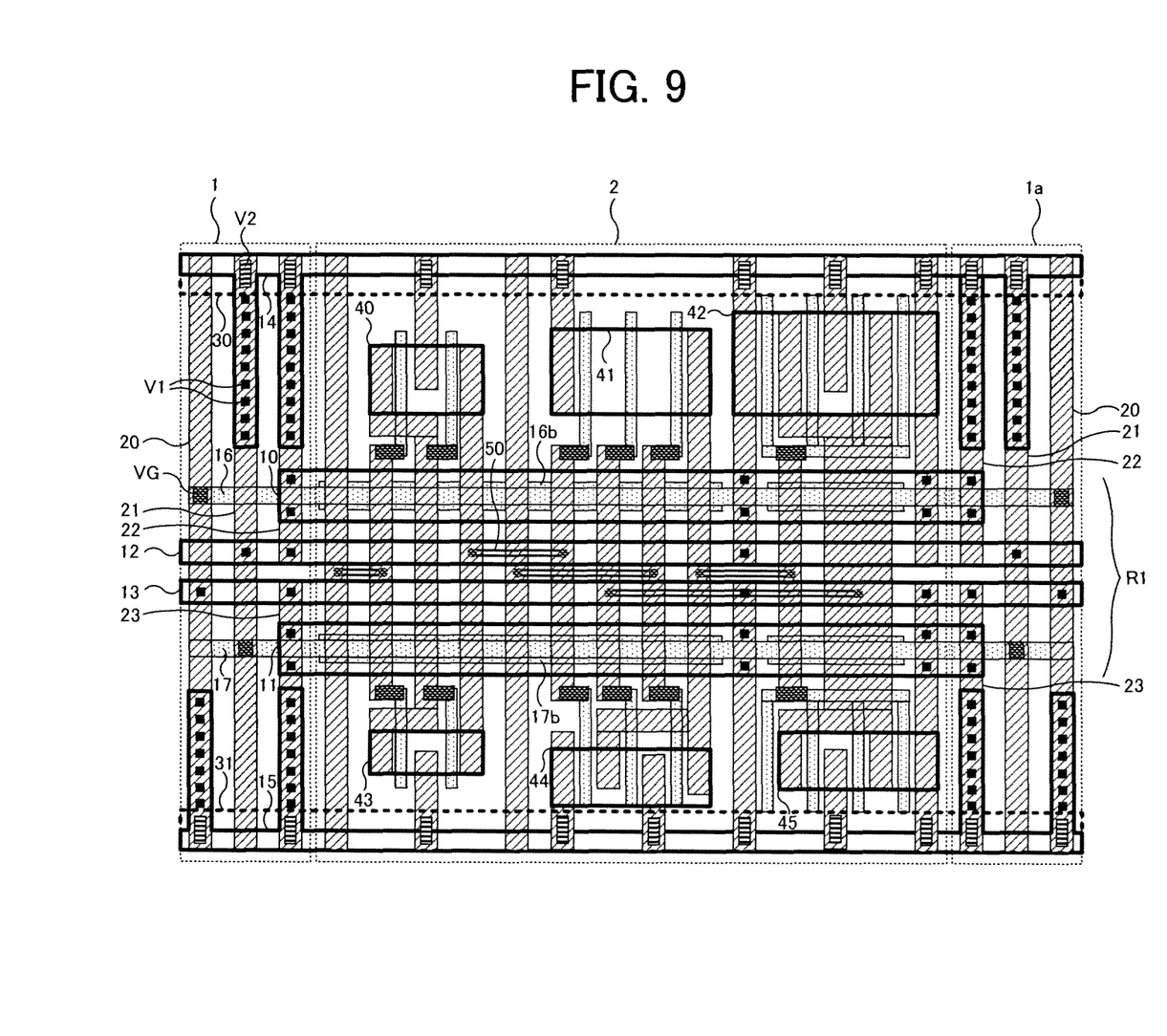
FIG. 9 is a diagram showing another modification corresponding to the layout example shown in FIG. 2.

FIG. 9 shows another modification corresponding to the layout example shown in FIG. 2. The layout example of FIG. 9 is different from FIG. 2 in that the gate lines 16 and 17 of the compensation capacitors C1 and C2, which extend into the circuit cell 2, are formed partially with a wide width. That is, in the circuit cell 2 of FIG. 9, widening portions 16b and 17b are added to the gate lines 16 and 17 in a region where the contacts V1 connected to each source/drain of the compensation capacitors C1 and C2 are not formed. By employing the structure of FIG. 9, areas of the gate lines 16 and 17 increase, and capacitance values of the compensation capacitors C1 and C2 can be correspondingly increased.

Figure 10A:
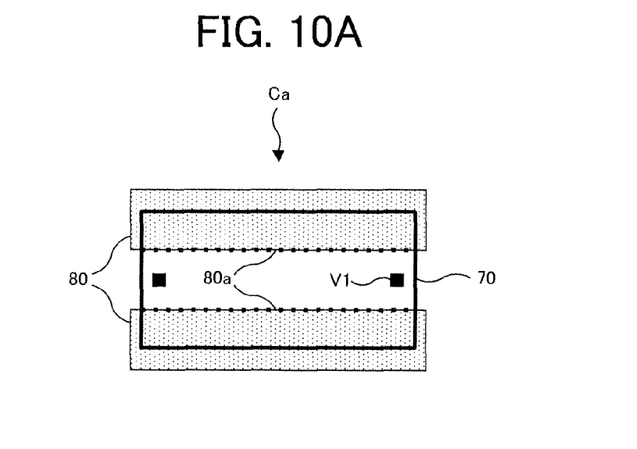
FIGS. 10A, 10B and 10C are diagrams showing specific examples of the transistor structure in order to increase capacitance values of compensation capacitors C1 and C2 using a sidewall capacitance of the gate.
Figure 10B:
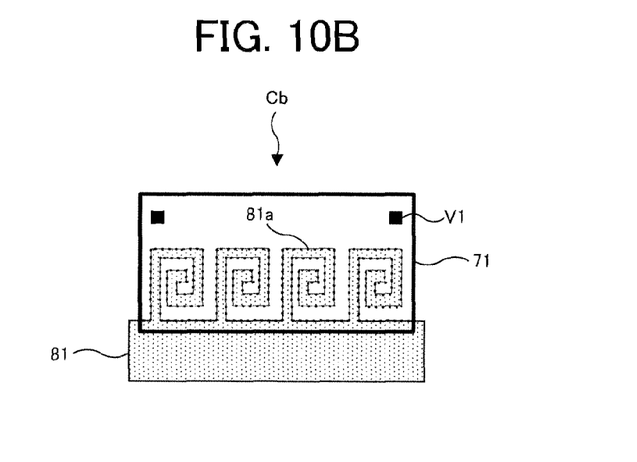
Figure 10C:
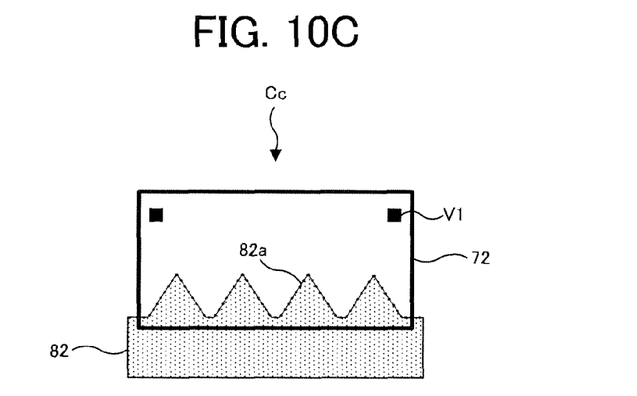

Further, in the first embodiment, various structures can be employed in order to increase the compensation capacitor. For example, FIGS. 10(A), 10(B) and 10(C) show specific examples which increase the capacitance values of the compensation capacitors C1 and C2 using a sidewall capacitance of the gate. A compensation capacitor Ca of FIG. 10A is formed by arranging a pair of gate lines 80 in parallel on both sides of contacts V1 for the source/drain in a diffusion layer 70, and the capacitance value of the compensation capacitor Ca is increased by a capacitance of gate sidewalls 80a. A compensation capacitor Cb of FIG. 10B is formed by arranging a gate line 81 on one side of a diffusion layer 71, and the capacitance value of the compensation capacitor Cb is increased by capacitances of gate sidewalls 81a each having a spiral section protruded from the gate line 81. A compensation capacitor Cc of FIG. 10C is formed by arranging a gate line 82 on one side of a diffusion layer 72, and the capacitance value of the compensation capacitor Cc is increased by capacitances of gate sidewalls 82a each having a triangular section protruded from the gate line 81.

Second Embodiment

Figure 11:
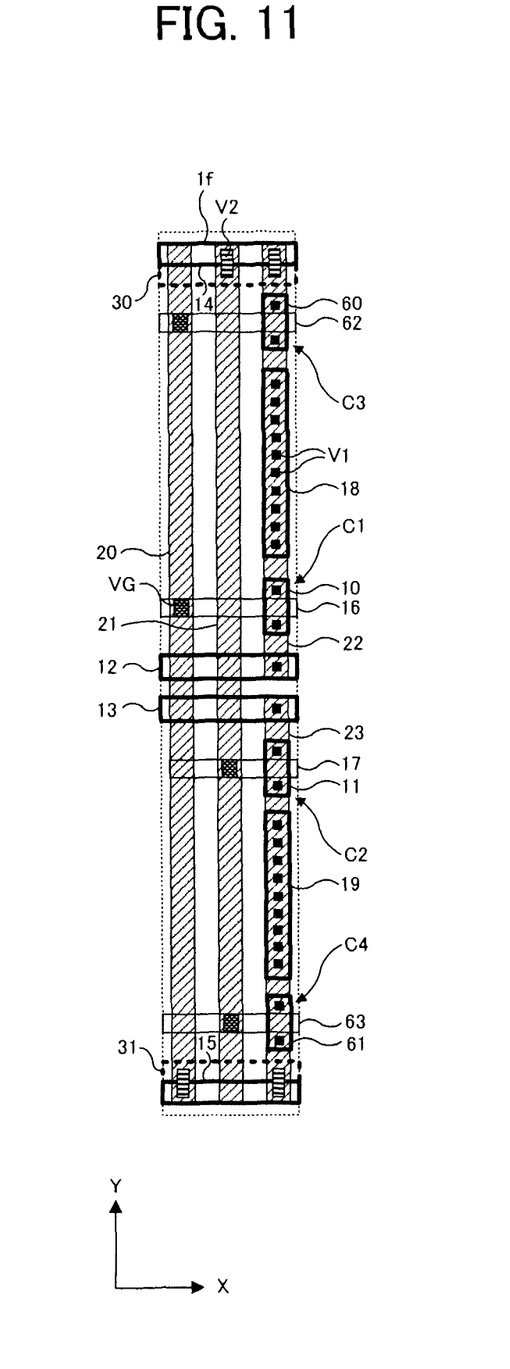
FIG. 11 is a diagram showing a structure example of a basic end cell 1f corresponding to the basic end cell 1 of FIG. 1 in a semiconductor device of a second embodiment.

FIG. 11 is a diagram showing a structure example of a basic end cell 1f corresponding to the basic end cell 1 of FIG. 1 in a semiconductor device of a second embodiment. The basic end cell 1f of the second embodiment has a feature capable of being connected to compensation capacitors C3 and C4 arranged in the vicinity of both ends in the Y direction in addition to the compensation capacitors C1 and C2 near the center in the basic end cell 1 of FIG. 1. In the basic end cell 1f shown in FIG. 11, the diffusion layers 10 and 11 corresponding to the compensation capacitors C1 and C2, the gate lines 16 and 17, the well contacts 12 and 14, and the sub-contacts 13 and 15 have the same structures as those in FIG. 1, so description thereof will be omitted. Although the lines 20 to 23 of the metal layer M1 and the lines 30 and 31 of the metal layer M2 are different in size and shape from those in FIG. 1, they have common basic functions.

A transistor structure formed with a diffusion layer 60 and a gate line 62 thereabove functions as a second P-type compensation capacitor C3 at one end in the Y direction in the basic end cell 1f. The gate line 62 is connected to the sub-contact 13 in the same manner as the gate line 16, and the source/drain of the compensation capacitor C3 is connected to the well contact 12 in the same manner as the compensation capacitor C1. Further, a transistor structure formed with a diffusion layer 61 and a gate line 63 thereabove functions as a second N-type compensation capacitor C4 at the other end in the Y direction in the basic end cell 1f. The gate line 63 is connected to the well-contact 12 in the same manner as the gate line 17, and the source/drain of the compensation capacitor C4 is connected to the sub-contact 13 in the same manner as the compensation capacitor C2. In addition, a diffusion layer 18 connected to the line 22 is arranged in a region between the compensation capacitors C1 and C3, and a diffusion layer 19 connected to the line 23 is arranged in a region between the compensation capacitors C2 and C4.

Figure 12:
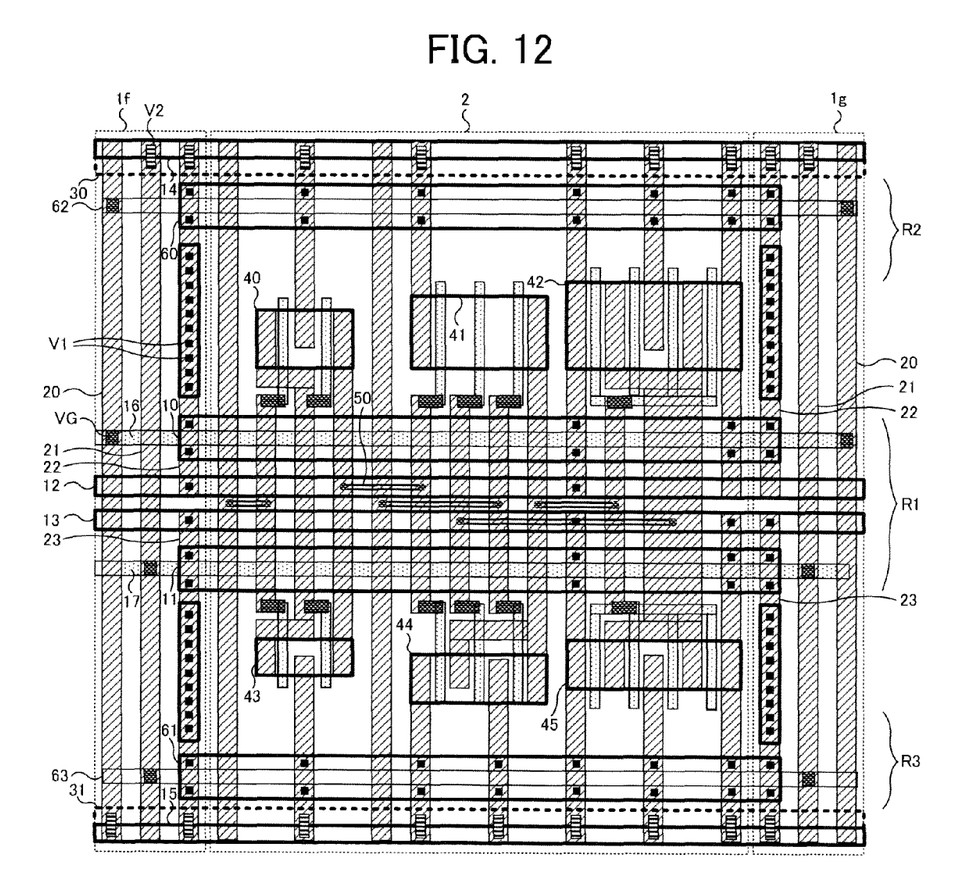
FIG. 12 is a diagram showing a layout example formed using the basic end cell 1f of FIG. 11 in the semiconductor device of the second embodiment.

FIG. 12 shows a layout example formed using the basic end cell 1f of FIG. 11 in the semiconductor device of the second embodiment. The layout example shown in FIG. 12 includes the basic end cell 1f arranged at the left end, a basic end cell 1g arranged at the right end, and the circuit cell 2 arranged in a region between the basic end cells 1f and 1g at the both ends. Here, the basic end cell 1g at the right end has a mirror arrangement of the basic end cell 1f of FIG. 11, and has the same basic function as that of the basic end cell 1f. The layout example of FIG. 12 has a structure in which a region R2 of the P-channel region and a region R3 of the N-channel region are respectively expanded in comparison with the layout of FIG. 2 of the first embodiment. Thus, structures of regions other than the regions R2 and R3 in FIG. 12 are approximately common to FIG. 1, including the inter-element connection region R1.

In the region R2, the diffusion layer 60 corresponding to the compensation capacitor C3 and the gate line 62 thereabove extend along the X direction. In the region R3, the diffusion layer 61 corresponding to the compensation capacitor C4 and the gate line 63 thereabove extend along the X direction. Then, each element of the circuit cell 2 is connected to the compensation capacitors C3 and C4 through the metal layer M2 intersecting the regions R2 and R3. In this manner, by employing the structure of the second embodiment, the regions R2 and R3, which are originally empty regions in the circuit cell 2, can be effectively utilized as spaces for arranging the compensation capacitors C3 and C4 so as to increase an entire area of the compensation capacitors C1 to C4, and it is possible to stabilize the supply voltage of the circuit cell 2. In addition, the semiconductor device of the second embodiment has many variations as in the first embodiment, and it goes without saying that the modifications shown in FIGS. 5 to 10 can be applicable.

In the foregoing, contents of the invention have been specifically described based on the embodiments. However, the present invention is not limited to the above described embodiments, and can variously be modified without departing the essentials of the present invention. For example, the arrangement of the basic end cell 1 and the structure of the compensation capacitors C1 and C2 can be modified within a range capable of achieving the same function. Further, the present invention can be applied to various semiconductor devices including semiconductor memories.

The invention claimed is:
1. A semiconductor device comprising:
   a circuit cell including a plurality of elements aligned in a first direction; and
   a basic end cell arranged adjacent to the circuit cell in the first direction and having a compensation capacitor capable of being connected to a supply voltage of the circuit cell, wherein a diffusion layer forming the compensation capacitor extends along the first direction in a predetermined region of the circuit cell, and wherein the compensation capacitor has a transistor structure in which a gate line is arranged over the diffusion layer, and the gate line extends along the first direction in the predetermined region in parallel to the diffusion layer, wherein a first basic end cell arranged at one end in the first direction of the circuit cell is provided as the basic end cell, and a second basic end cell arranged at the other end in the first direction of the circuit cell is provided as the basic end cell, wherein the diffusion layer forming the compensation capacitor and the gate line thereabove are shared by the first and second basic end cells.

2. The device as claimed in claim 1, wherein the predetermined region corresponds to an inter-element connection region in which targeted ones of lines of the plurality of elements are interconnected.

3. The device as claimed in claim 2, wherein a transistor of the compensation capacitor is connected to the supply voltage through one or more contacts formed at predetermined points of each of the plurality of elements.

4. The device as claimed in claim 1, wherein the basic end cell is arranged adjacent to the circuit cells on both sides, and the diffusion layer forming the compensation capacitor and the gate line thereabove extend along the first direction in the predetermined regions of the circuit cells on the both sides.

5. The device as claimed in claim 2,
wherein the inter-element connection region is provided between a P-channel region and an N-channel region in the circuit cell,
and the basic end cell comprises a P-type compensation capacitor capable of being connected to a supply voltage in the P-channel region and an N-type compensation capacitor capable of being connected to a supply voltage in the N-channel region.

6. The device as claimed in claim 5,
wherein the predetermined region corresponds to a first region of the P-channel region and a second region of the N-channel region respectively in addition to the inter-element connection region,
and the diffusion layer and the gate line corresponding to the P-type compensation capacitor extend into each of the inter-element connection region and the first region, and the diffusion layer and the gate line corresponding to the N-type compensation capacitor extend into each of the inter-element connection region and the second region.

7. A semiconductor device comprising:
a first area provided for a first compensation capacitor cell, the first compensation capacitor cell comprising a first capacitor coupled between first and second power supply lines and including a first lower electrode, a first upper electrode and a first dielectric film between the first lower and first upper electrodes, and a second capacitor coupled between the first and second power supply lines and including a second lower electrode, a second upper electrode and a second dielectric film between the second lower and second upper electrodes; and
a second area provided for a circuit cell and disposed adjacently to the first area, the circuit cell including at least one pair of a P-channel transistor and an N-channel transistor;
each of the first lower electrode, the first upper electrode and the first dielectric film of the first capacitor and each of the second lower electrode, the second upper electrode and the second dielectric film of the second capacitor being elongated over the second area.

8. The device as claimed in claim 7, wherein each of the first and second lower electrodes includes a diffusion layer and each of the first and second upper electrodes includes a gate wiring line.

9. The device as claimed in claim 7, further comprising a third area provided for a second compensation capacitor and disposed to cooperate with the first area to sandwich the second area, the second compensation capacitor comprising a third capacitor coupled between the first and second power supply lines and including a third lower electrode, a third upper electrode and a third dielectric film between the third lower and third upper electrodes, and a fourth capacitor coupled between the first and second power supply lines and including a fourth lower electrode, a fourth upper electrode and a fourth dielectric film between the fourth lower and fourth upper electrodes, the first lower electrode, the first upper electrode, the first dielectric film, the second lower electrode, the second upper electrode and the second dielectric film being elongated to cross the second area and to be connected respectively to the third lower electrode, the third upper electrode, the third dielectric film, the fourth lower electrode, the fourth upper electrode and the fourth dielectric film.

10. The device as claimed in claim 9, wherein each of the first, second, third and fourth lower electrodes includes a diffusion layer and each of the first, second, third and fourth upper electrodes includes a gate wiring line.

11. A semiconductor device comprising:
a first area provided for a first compensation capacitor cell, the first compensation capacitor cell comprising a capacitor that is coupled between first and second power supply lines and includes a first electrode, a second electrode and a dielectric film between the first and second electrodes; and
a second area provided for a circuit cell and disposed adjacently to the first area, the circuit cell including a plurality of transistors;
each of the first electrode, the second electrode and the dielectric film of the capacitor being elongated from the first area over the second area to provide an elongated first electrode, an elongated second electrode and an elongated dielectric film in the second area.

12. The device as claimed in claim 11, wherein each of the first electrode and the elongated first electrode includes a diffusion layer and each of the second electrodes and the elongated second electrode includes a gate wiring line.

13. The device as claimed in claim 12, wherein each of the transistors of the circuit cell is connected to a selected one of the first and second power supply lines, and at least one of the elongated first electrode and the elongated second electrode is connected to a corresponding one of the first and second power supply lines.

14. The device as claimed in claim 11, wherein each of the first and second power supply lines is elongated from the first area over the second area to provide an elongated first power supply line and an elongated second power supply line in the second area, each of the transistors is connected to a corresponding one of the elongated first and second power supply line, and the elongated first electrode is connected to the elongated first power supply line in the second area.

15. The device as claimed in claim 14, each of the first electrode and the elongated first electrode comprises a diffusion region.

* * * * *